(12) United States Patent
Robertson

(10) Patent No.: US 6,420,984 B1
(45) Date of Patent: Jul. 16, 2002

(54) OPTICAL KERR EFFECT ANALOG TO DIGITAL CONVERTER

(75) Inventor: Richard L. Robertson, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/384,608

(22) Filed: Aug. 27, 1999

(51) Int. Cl.⁷ ................................................. H03M 1/00

(52) U.S. Cl. ....................................... 341/137; 341/155

(58) Field of Search ................................ 341/137, 155; 359/245, 127, 237

(56) References Cited

U.S. PATENT DOCUMENTS 4,058,722 A * 11/1977 Taylor ........................ 250/255
4,831,376 A * 5/1989 Reid et al. .................... 341/13
4,851,840 A * 7/1989 McAulay .................... 341/137

* cited by examiner

*Primary Examiner*—Peguy JeanPierre
(74) *Attorney, Agent, or Firm*—Nathan O. Jensen; Kyle Eppele

(57) ABSTRACT

An optical analog-to-digital converter (ADC) comprises an analog input, an electromagnetic wave generator operatively connected to the analog input, an intensity discriminating material to refract an output electromagnetic wave, and an electromagnetic wave detector. The electromagnetic wave generator must be able to produce an output wave of sufficient intensity to induce a change in the refractive index of the intensity discriminating material. The electromagnetic wave generator must also be able to produce an output wave of varying intensity, the intensity being dependent on the analog input. An intensity discriminating material is one that has a different index of refraction for electromagnetic waves of different intensities. The method of converting an analog signal to a digital signal includes the steps of providing an analog input and generating an electromagnetic wave therefrom with the wave generator. The electromagnetic wave is passed through the intensity discriminating material and is refracted thereby. The refracted wave is then detected by the detector, which outputs a digital signal in response thereto.

20 Claims, 2 Drawing Sheets

OPTICAL KERR EFFECT ANALOG TO DIGITAL CONVERTER

BACKGROUND OF THE INVENTION

1. Field of the Invention

The present invention relates to an optical analog-to-digital converter. More particularly, the present invention relates to a device that utilizes a laser, an intensity discriminating material, and a light detector to convert an analog input signal to a digital output.

2. Problems in the Art

Analog-to-digital converters (ADC) are well known in the art. Typical ADCs utilize silicon transistors. A typical ADC samples an analog signal and converts the sampled signal to a discrete value by methods that are well known in the art. Although silicon based ADCs function well at lower speeds, there are physical limits as to the speed at which conversion can be performed. A need exists for an ADC which can operate at a higher frequency. An ADC that utilizes the faster nature of light would improve over the speed offered by current prior art ADCs. Such an improved ADC is disclosed by the present invention.

3. Features of the Invention

A primary feature of the invention is the provision of a method and apparatus that converts an analog signal to a digital signal at greater speeds than those currently known in the art.

Another feature of the present invention is a method and apparatus that converts an analog signal to a digital signal using an intensity modulated laser, an intensity discriminating prism, and a linear detector array.

A further feature of the present invention is an apparatus which utilizes a crystal, having a varying index of refraction, for analog-to-digital conversion wherein laser beams of varying intensity are refracted to varying degrees, and the refracted beam is detected by a linear detector, which produces a digitized output from the analog input of the laser.

These as well as other features of the invention will be apparent from the following detailed description in conjunction with the accompanying drawings.

SUMMARY OF THE INVENTION

An optical analog-to-digital converter (ADC) comprises an analog input, an electromagnetic wave generator operatively connected to the analog input, an intensity discriminating material to refract an output electromagnetic wave, and an electromagnetic wave detector. Preferably, the electromagnetic wave generator is a laser and the intensity discriminating material is a prism. The electromagnetic wave generator must be able to produce an output wave of sufficient intensity to induce a change in the refractive index of the intensity discriminating material. The electromagnetic wave generator must also be able to produce an output wave of varying intensity, the intensity being dependent on the analog input. An intensity discriminating material is one that has a different index of refraction for electromagnetic waves of different intensities. The output from the electromagnetic wave generator hits the intensity discriminating material and is refracted. The electromagnetic wave detector detects the refracted wave and outputs a digital signal.

The method of converting an analog signal to a digital signal includes the steps of providing an analog input and generating an electromagnetic wave. The intensity of the electromagnetic wave is dependent on the analog input. The electromagnetic wave is passed through the intensity discriminating material. The electromagnetic wave must be of sufficient intensity to induce a change in the refractive index of the intensity discriminating material. The electromagnetic wave is refracted by the intensity discriminating material and is then detected by the detector, which outputs a digital signal.

DETAILED DESCRIPTION OF AN EXEMPLARY EMBODIMENT

Figure 1:
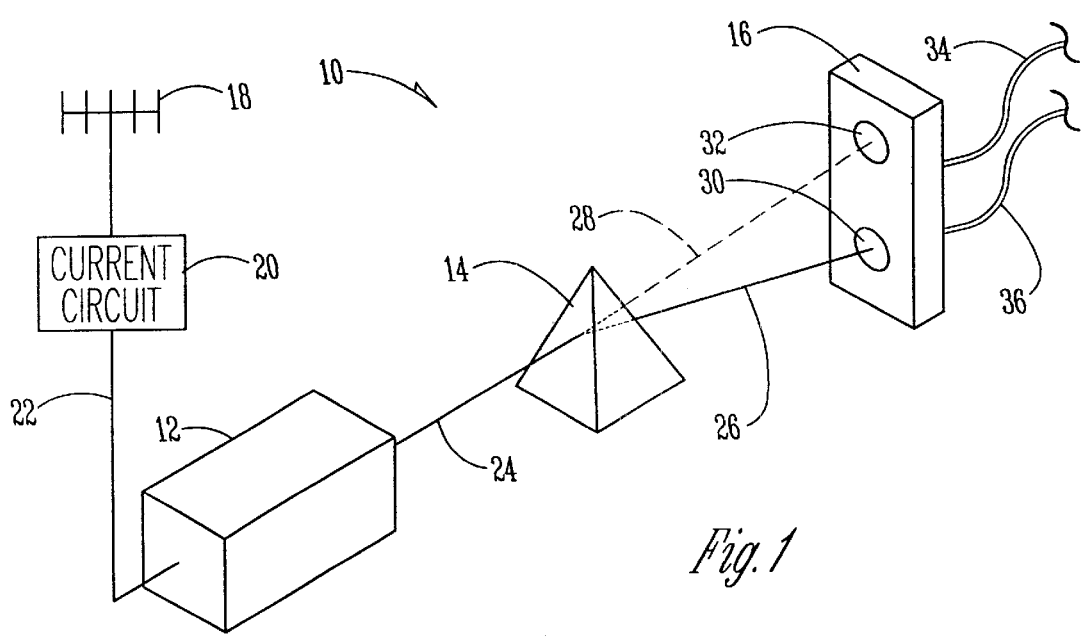
FIG. 1 is a schematic view of an optical analog-to-digital converter according to the present invention.

The present invention will be described as it applies to an exemplary embodiment. It is not intended that the present invention be limited to the described embodiments. It is intended that the invention cover all alternatives, modifications, and equivalents which may be included within the spirit and scope of the invention.

An optical analog-to-digital converter (ADC) according to the present invention is generally referenced by the numeral 10. The optical ADC 10 comprises three parts: an electromagnetic wave generator, such as a laser 12; an intensity discriminating material, such as a prism 14; and an electromagnetic wave detector, such as a linear detector array 16. An analog signal 22 is input into the laser 12. The laser 12 outputs an electromagnetic wave 24. The intensity of the electromagnetic wave 24 depends on the analog input signal 22. As the input signal 22 varies, the intensity of the output wave 24 varies. A laser that could be used is a diode pumped Nd:YAG having an output wavelength of 1.064 micrometers. The proper wavelength for the output wave 24 is determined based on the physical properties of the intensity discriminating material 14. Other lasers that can modulate the intensity of the output beam in response to an analog input could be used.

In the example shown in FIG. 1, the optical ADC 10 is utilized in a radio. The antenna 18 receives radio waves. The energy of the radio waves is converted to an electrical current by the current circuit 20. The current circuit 20 outputs an analog current 22 of varying magnitude. The analog current 22 modulates the intensity of the electromagnetic wave 24. It is understood that the analog input signal 22 may come from any source. The optical ADC 10 will work with any analog input.

The electromagnetic wave 24 that is output from the laser 12 is directed toward the prism 14. It is also understood that shapes other than a prism, be used to refract the wave 24. As is understood in the art, as long as the face where the electromagnetic wave 24 enters is not parallel to the face where the electromagnetic wave 24 exits, then there will be refraction of the electromagnetic wave 24.

The prism 14 must be composed of an intensity discriminating material. For this invention, an intensity discriminating material is a material that exhibits third-order nonlinear polarization, wherein the refractive index changes when an electromagnetic wave 24 of sufficient intensity passes through the material, and where the change in refractive index will vary as the intensity of the electromagnetic wave 24 varies. This third-order effect is known as the optical Kerr effect. Silicon is one material that exhibits this third-order effect. Not all materials will undergo a change in the refractive index in response to an intense electromagnetic wave.

Currently, the speed of the optical ADC 10 is limited by the response time of the prism 14. There are commercially available lasers that can be pulsed on the order of 60–70 femtoseconds. There are commercially available detector arrays 16 that have detectors 30, 32 having nanosecond response times. A silicon prism is currently limited to a frequency of around 20 MHz. There are materials other than silicon, which have a faster response time, which could be used in the prism 14. The trade-off with using a faster material in the prism 14 is that the material will generate smaller changes in the refractive index in response to the electromagnetic wave 24.

The electromagnetic wave 24 must be of sufficient intensity to induce a change of the refractive index within the prism 14. Currently, only lasers are capable of producing an electromagnetic wave of sufficient intensity to change the refractive index. However, it is conceivable that in the future different methods will be developed that can produce electromagnetic waves of sufficient intensity to change the refractive index. Therefore, it is not intended that the invention be limited to the use of a laser. The intensity that the electromagnetic wave 24 must possess in order to induce a change in the refractive index will depend on the intensity discriminating material that is used. Different materials will require different intensities.

The functioning of the optical ADC 10 will now be fully described. An analog signal 22 is input to the laser 12, which generates an electromagnetic wave 24. Modulation of the analog input 22 modulates the intensity of the electromagnetic wave 24. The electromagnetic waves 24 are directed to the prism 14, with all waves 24 entering the prism 14 at the same spot. However, the electromagnetic waves will exit at different locations, depending on the wave intensity.

An electromagnetic wave 26 refracted from the wave 24 at a first intensity exits the prism 14 at a first angle from a first location. The electromagnetic wave 26 hits a light detector 30, which produces a digital output in response to the electromagnetic wave 26. The digital output of the light detector 30 is sent out on electrical line 36 for further signal processing which is not a part of the present invention. An electromagnetic wave 28 refracted from the wave 24 at a second intensity exits the prism 14 at a second angle from a second location. The electromagnetic wave 28 is detected by the second light detector 32, which converts it to a digital signal that is sent out on line 34 for additional processing. Electromagnetic wave 26 is at a higher intensity than electromagnetic wave 28. The two electromagnetic waves 26, 28 "see" a prism having different refractive indexes. As discussed earlier, this difference in refraction is due to the difference in intensity of the two waves 26, 28.

The linear detector array 16 is shown having two detectors 30, 32 for purposes of illustration. The detectors 30, 32 are preferably photodiodes. In practice, there will be more than two detectors. There are commercially available photodiode arrays on an integrated circuit that have as many as 2048 detectors. The number of detectors that are used will depend on the resolution required of the optical ADC 10. Detectors other than photodiodes could be used. Any detector that produces a digital output could be utilized.

Figure 2:
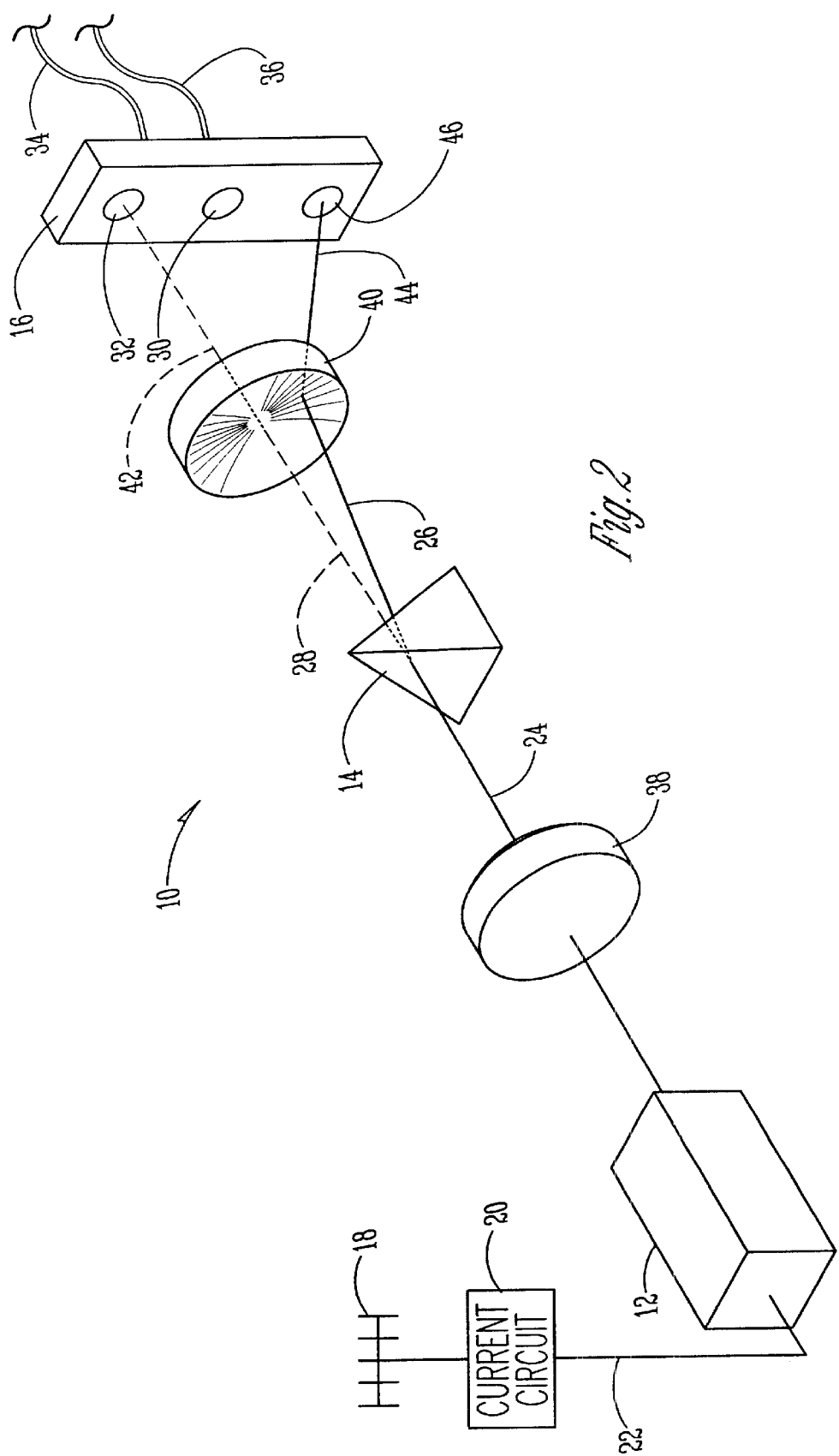
FIG. 2 is a schematic view similar to FIG. 1, showing the use of a converging lens and a diverging lens with the optical ADC of FIG. 1.

An alternative embodiment of the present invention is shown in FIG. 2. A converging lens 38 is placed between the laser 12 and the prism 14. The converging lens 38 is used to increase the intensity of the electromagnetic wave 24. The optical properties of the lens will vary depending on the type of laser 12 that is used and the desired intensity of the electromagnetic wave 24. The diverging lens 40 is placed between the prism 14 and the linear detector array 16. The diverging lens 40 is used to magnify deviations in path angles between refracted waves having similar, but not identical, intensities. As shown in FIG. 2, electromagnetic wave 28 passes through the center of the diverging lens 40 and therefore is unaffected by the lens 40. Electromagnetic wave 44 results from the refraction of electromagnetic wave 26 as it passes through the diverging lens 40. Due to the diverging lens, electromagnetic wave 40 hits detector 46, rather than detector 30 (FIG. 1). Electromagnetic wave 42 (labeled 28 before it reaches the lens 40) passes through the center of the lens 40 and therefore is not refracted. A diverging lens 40 is useful in situations where the change in the refractive index of the prism 14 is small in response to a change in intensity of the electromagnetic wave.

From the foregoing, it can be seen that the invention possesses at least all of the stated features.

I claim:

1. An optical analog-to-digital converter, comprising:

an analog input;

an electromagnetic wave generator operatively connected to the analog input, the electromagnetic wave generator being capable of producing output electromagnetic waves of varying intensity, the intensity being dependent on the analog input;

an intensity discriminating material for refracting the electromagnetic waves; and an electromagnetic wave detector for detecting the refracted electromagnetic waves so as to generate digital signals in response thereto.

2. The converter of claim 1 wherein the electromagnetic wave generator is a laser.

3. The converter of claim 2 wherein the laser is a diode pumped laser.

4. The converter of claim 2 wherein the laser is an Nd:YAG laser.

5. The converter of claim 4 wherein the laser outputs an electromagnetic wave having a wavelength of about 1.064 micrometers.

6. The converter of claim 1 wherein the intensity discriminating material is silicon.

7. The converter of claim 1 wherein the intensity discriminating material is in the shape of a prism.

8. The converter of claim 1 wherein the electromagnetic detector is a linear detector array of photodiodes.

9. The converter of claim 1 further comprising a converging lens between the laser and the intensity discriminating material.

10. The converter of claim 1 further comprising a diverging lens between the intensity discriminating material and the electromagnetic wave detector.

11. A method of converting an analog signal to a digital signal, comprising:

providing an analog signal;

generating an electromagnetic wave from the analog signal, the intensity of the electromagnetic wave being dependent on the analog signal;

passing the electromagnetic wave through an intensity discriminating material wherein the electromagnetic wave is refracted;

detecting the refracted electromagnetic wave; and outputting a digital signal based on the detected wave.

12. The method of claim 11 wherein the electromagnetic wave is generated by a laser.

13. The method of claim 12 wherein the laser is an Nd:YAG laser.

14. The method of claim 11 wherein the intensity discriminating material is in the shape of a prism for refracting the wave.

15. The method of claim 11 further comprising:

passing the electromagnetic wave through a converging lens prior to passing the electromagnetic wave through the intensity discriminating material.

16. The method of claim 11 further comprising:

passing the electromagnetic wave through a diverging lens after passing the electromagnetic wave through the intensity discriminating material.

17. An optical analog-to-digital converter, comprising:

an analog input;

a laser operatively connected to the analog input, the laser capable of outputting electromagnetic waves of varying intensity;

an intensity discriminating material having two non-parallel faces positioned such that an electromagnetic wave from the laser will enter at one of the faces and exit at the other face, the electromagnetic wave being refracted by the intensity discriminating material;

an electromagnetic detector to detect the refracted wave, the detector outputting a digital signal based on the detected wave.

18. The converter of claim 17, further comprising:

a converging lens between the laser and the intensity discriminating material; and a diverging lens between the intensity discriminating material and the electromagnetic detector.

19. The converter of claim 17 wherein the laser is an Nd:YAG having an output wavelength of approximately 1.064 micrometers.

20. The converter of claim 19 wherein the intensity discriminating material is prism shaped and the electromagnetic detector is a linear detector array.

* * * * *